United States Patent
Hasegawa

(10) Patent No.: US 12,425,021 B2
(45) Date of Patent: Sep. 23, 2025

(54) GATE DRIVE CIRCUIT OF POWER CONVERTER

(71) Applicant: MEIDENSHA CORPORATION, Tokyo (JP)

(72) Inventor: Isamu Hasegawa, Numazu (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 18/846,758

(22) PCT Filed: Mar. 3, 2023

(86) PCT No.: PCT/JP2023/008082
§ 371 (c)(1),
(2) Date: Sep. 13, 2024

(87) PCT Pub. No.: WO2023/176515
PCT Pub. Date: Sep. 21, 2023

(65) Prior Publication Data
US 2025/0112636 A1 Apr. 3, 2025

(30) Foreign Application Priority Data
Mar. 17, 2022 (JP) .................. 2022-042935

(51) Int. Cl.
*H03K 17/691* (2006.01)
*H02M 1/00* (2007.01)
*H02M 1/088* (2006.01)

(52) U.S. Cl.
CPC ........ *H03K 17/691* (2013.01); *H02M 1/0006* (2021.05); *H02M 1/088* (2013.01)

(58) Field of Classification Search
CPC ... H03K 17/691; H02M 1/0006; H02M 1/088
See application file for complete search history.

(56) References Cited

U.S. PATENT DOCUMENTS

| 4,535,400 A | 8/1985 | Itani |
| 5,625,548 A | 4/1997 | Gold et al. |

(Continued)

FOREIGN PATENT DOCUMENTS

| CN | 203482442 U | 3/2014 |
| CN | 104065253 A | 9/2014 |

(Continued)

OTHER PUBLICATIONS

Chinese Office Action for Application No. 202380026865.2, mailing date Apr. 25, 2025, 10 pages with English translation.

*Primary Examiner* — Metasebia T Retebo
(74) *Attorney, Agent, or Firm* — Foley & Lardner LLP

(57) ABSTRACT

A gate drive circuit of a power converter includes semiconductor devices connected in series and pulse transformers, each of which includes a primary winding and a secondary winding. The primary windings of the pulse transformers are connected in series; the secondary windings of the pulse transformers are respectively connected to the semiconductor devices directly or indirectly; and the pulse transformers establish insulation between a primary side and a secondary side of the pulse transformers, while transmitting electric power or electric power and control signals from the primary side to the secondary side. Auxiliary windings are provided that establish magnetic coupling between the pulse transformers.

1 Claim, 6 Drawing Sheets

(56) References Cited

U.S. PATENT DOCUMENTS

| | | | |
|---|---|---|---|
| 6,239,988 B1 | 5/2001 | Marziale et al. | |
| 2013/0099831 A1* | 4/2013 | Permuy | H03K 17/10 327/109 |
| 2014/0104911 A1 | 4/2014 | Wu et al. | |
| 2015/0380931 A1 | 12/2015 | Gan et al. | |

FOREIGN PATENT DOCUMENTS

| | | | |
|---|---|---|---|
| JP | H10-507336 A | | 7/1998 |
| JP | 2007258106 A | * | 10/2007 |
| JP | 5221203 B2 | | 6/2013 |
| JP | 2018-042439 A | | 3/2018 |
| JP | 2019-097296 A | | 6/2019 |

\* cited by examiner

--Prior Art--

GATE DRIVE CIRCUIT OF POWER CONVERTER

TECHNICAL FIELD

The present invention relates to a gate drive circuit of a power converter.

BACKGROUND ART

FIG. 6 shows a circuit configuration according to Patent Document 1. Patent Document 1 (FIG. 6) discloses an invention directed to a gate drive circuit of a semiconductor device, which is configured to drive pulse transformers 15 with an AC/DC converter 13 and a transformer driver circuit 14 and thereby transmit electric power for gate driving while establishing insulation.

However, the circuit of FIG. 6 is configured to connect primary windings 16 of the pulse transformers 15 in series and exert voltages on the primary windings 16. This may cause unevenness in excitation inductance of the pulse transformers 15 and thereby cause problems described below.

Unevenness in secondary-side voltage may increase duties of diode bridge rectifier circuits 27 etc.

Furthermore, the imbalance in voltage exerted on the pulse transformers 15 may increase the pulse transformers 15 in iron loss and then in size of cores thereof.

In view of the foregoing, it is desired to provide a gate drive circuit of a power converter that serves to solve imbalance in exerted voltage due to causes such as unevenness in manufacturing of pulse transformers.

PRIOR ART DOCUMENT(S)

Patent Document(s)

Patent Document 1: JP 5221203 B

SUMMARY OF THE INVENTION

The present invention considers the conventional problems described above. According to one aspect of the present invention, a gate drive circuit of a power converter includes: semiconductor devices connected in series; pulse transformers each of which includes a primary winding and a secondary winding, wherein: the primary windings of the pulse transformers are connected in series; the secondary windings of the pulse transformers are respectively connected to the semiconductor devices directly or indirectly; and the pulse transformers establish insulation between a primary side and a secondary side of the pulse transformers, while transmitting electric power or electric power and control signals from the primary side to the secondary side; and an auxiliary windings that establishes magnetic coupling between the pulse transformers.

According to another aspect, the gate drive circuit includes n stages of the pulse transformers, where n is a natural number equal to or greater than 2. The pulse transformer of a first stage is provided with a post-stage coupling auxiliary winding that establishes magnet coupling with the pulse transformer of a post-stage of the first stage. The pulse transformer of each stage except the first stage and a nth stage is provided with: a pre-stage coupling auxiliary winding that establishes magnet coupling with the pulse transformer of a pre-stage of the each stage; and a post-stage coupling auxiliary winding that establishes magnet coupling with the pulse transformer of a post-stage of the each stage. The pulse transformer of the nth stage is provided with a pre-stage coupling auxiliary winding that establishes magnet coupling with the pulse transformer of a pre-stage of the nth stage. The post-stage coupling auxiliary winding of the pulse transformer of a kth stage and the pre-stage coupling auxiliary winding of the pulse transformer of a (k+1)th stage are connected to each other, where k is one of natural numbers from 1 to n−1.

The above aspects of the present invention serve to provide a gate drive circuit of a power converter that solve imbalance in exerted voltage due to causes such as unevenness in manufacturing of pulse transformers.

MODE(S) FOR CARRYING OUT THE INVENTION

The following details first to third embodiments of a gate drive circuit of a power converter according to the present invention, with reference to FIGS. 1 to 5.

First Embodiment

Figure 1:
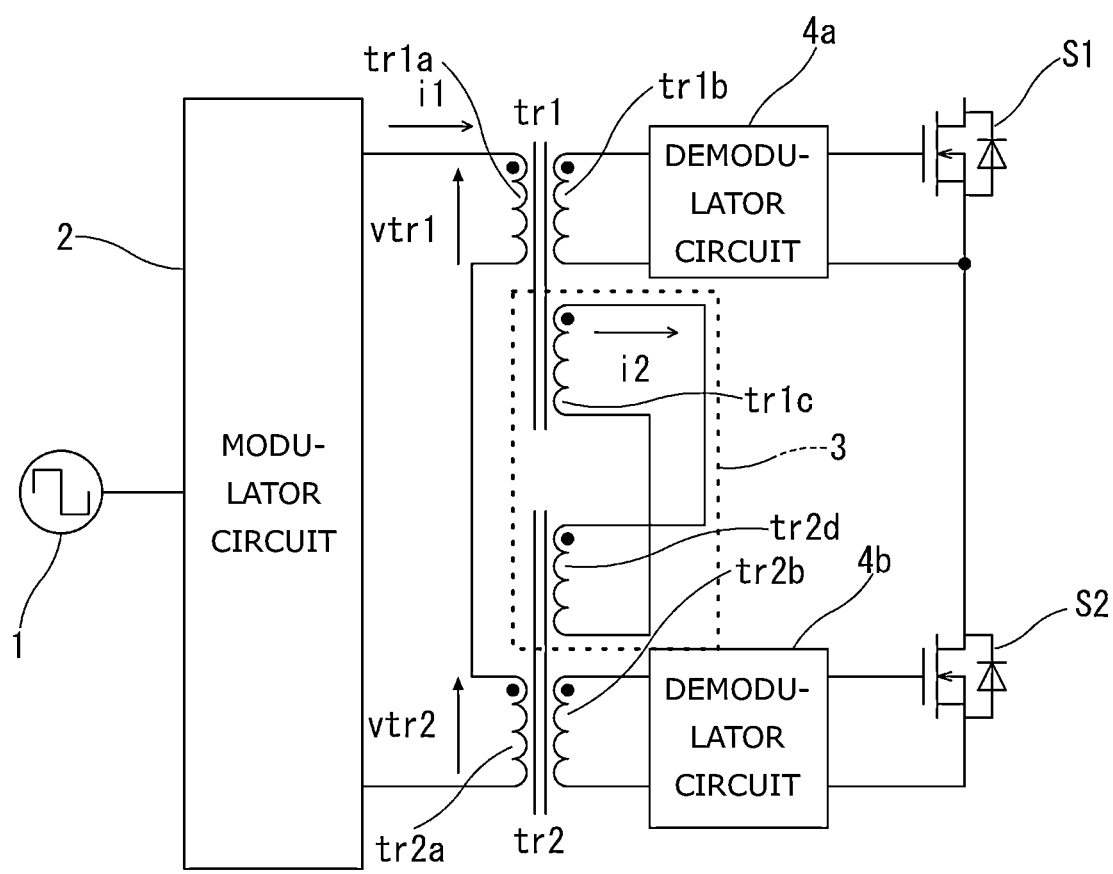
FIG. 1 is a diagram showing a gate drive circuit of a power converter according to a first embodiment.

FIG. 1 exemplifies a circuit configuration of a gate drive circuit of a power converter according to the first embodiment.

FIG. 1 shows an alternating-current power source 1, a modulator circuit 2, pulse transformers tr1 and tr2, an auxiliary winding 3, demodulator circuits 4a and 4b, and semiconductor devices S1 and S2. The semiconductor devices S1 and S2 are connected in series, and thereby achieve a high withstand voltage.

The gate drive circuit of the power converter according to the first embodiment is a case of connecting the two pulse transformers tr1 and tr2 in series.

The first-stage pulse transformer tr1 includes a primary winding tr1a and a secondary winding tr1b, and is further provided with a post-stage coupling auxiliary winding tr1c. The post-stage coupling auxiliary winding tr1c serves to establish magnetic coupling with the post-stage pulse transformer tr2.

The second-stage pulse transformer tr2 includes a primary winding tr2a and a secondary winding tr2b, and is further provided with a pre-stage coupling auxiliary winding tr2d. The pre-stage coupling auxiliary winding tr2d serves to establish magnetic coupling with the pre-stage pulse transformer tr1.

In the pulse transformers tr1 and tr2, the primary windings tr1a and tr2a are connected to each other in series, while the secondary windings tr1b and tr2b are respectively connected to the semiconductor devices S1 and S2 indirectly via the demodulator circuits 4a and 4b. The pulse transformers tr1 and tr2 establish insulation between a primary side and a secondary side of the pulse transformers tr1 and tr2, while transmitting electric power or electric power and control signals from the primary side to the secondary side.

The post-stage coupling auxiliary winding tr1c and the pre-stage coupling auxiliary winding tr2d are connected to each other, and thereby form the auxiliary winding 3. The auxiliary winding 3 establishes magnetic coupling between the pulse transformers tr1 and tr2. A reference numeral i1 represents an electric current flowing in the primary windings tr1a and tr2a. A reference numeral i2 represents an electric current flowing in the auxiliary winding 3.

In case that the pulse transformers tr1 and tr2 have unevenness therebetween in excitation inductance and thereby have a difference in voltage exerted on the pulse transformers tr1 and tr2, the electric current i2 flows in the auxiliary winding 3. This balances the voltages exerted on the pulse transformers tr1 and tr2. This effect of the auxiliary winding 3 can be proved with use of mathematical expressions as follows.

The following mathematical expressions (1) and (2) respectively express a voltage vtr1 exerted on the pulse transformer tr1 and a voltage vtr2 exerted on the pulse transformer tr2, where: L1 is a self-inductance of the pulse transformer tr1; M1 is a mutual inductance between the pulse transformer tr1 and the post-stage coupling auxiliary winding tr1c; L2 is a self-inductance of the pulse transformer tr2; and M2 is a mutual inductance between the pulse transformer tr2 and the pre-stage coupling auxiliary winding tr2d.

[Mathematical Expression 1]

$$vtr1 = L1\frac{di1}{dt} - M1\frac{di2}{dt} \quad (1)$$

[Mathematical Expression 2]

$$vtr2 = L2\frac{di1}{dt} + M2\frac{di2}{dt} \quad (2)$$

The following mathematical expressions (3) and (4) respectively express the mutual inductances M1 and M2, where: L3 is a self-inductance of the post-stage coupling auxiliary winding tr1c provided for the pulse transformer tr1; k1 is a magnetic coupling factor between the pulse transformer tr1 and the post-stage coupling auxiliary winding tr1c; L4 is a self-inductance of the pre-stage coupling auxiliary winding tr2d provided for the pulse transformer tr2; and k2 is a magnetic coupling factor between the pulse transformer tr2 and the pre-stage coupling auxiliary winding tr2d.

[Mathematical Expression 3]

$$M1 = k1\sqrt{L1L3} \quad (3)$$

[Mathematical Expression 4]

$$M2 = k2\sqrt{L2L4} \quad (4)$$

The following mathematical expression (5) expresses a voltage equation in the auxiliary winding 3 that is derived from the Kirchhoff's law.

[Mathematical Expression 5]

$$M1\frac{di1}{dt} - M2\frac{di1}{dt} - L3\frac{di2}{dt} - L4\frac{di2}{dt} = 0 \quad (5)$$

Then, assuming that a turns ratio between the primary winding tr1a of the pulse transformer tr1 and the post-stage coupling auxiliary winding tr1c is equal to a turns ratio between the primary winding tr2a of the pulse transformer tr2 and the pre-stage coupling auxiliary winding tr2d, and the magnetic couplings are ideally established (i.e., the coupling factors k1, k2=1), equations of L3=L1 and L4=L2 are satisfied. Therefore, equations of M1=L1 and M2=L2 are satisfied, and the mathematical expression (5) can be transformed into the following mathematical expression (6).

[Mathematical Expression 6]

$$L1\frac{di1}{dt} - L2\frac{di1}{dt} - L1\frac{di2}{dt} - L2\frac{di2}{dt} = 0 \quad (6)$$

Substituting the mathematical expressions (1) and (2) into the mathematical expression (6), the following mathematical expression (7) is obtained. This shows that the auxiliary winding 3 allows the voltages exerted on the pulse transformers tr1 and tr2 to be equated even if excitation inductance values are different between the pulse transformers tr1 and tr2.

[Mathematical Expression 7]

$$vtr1 = vtr2 \quad (7)$$

Figure 2:
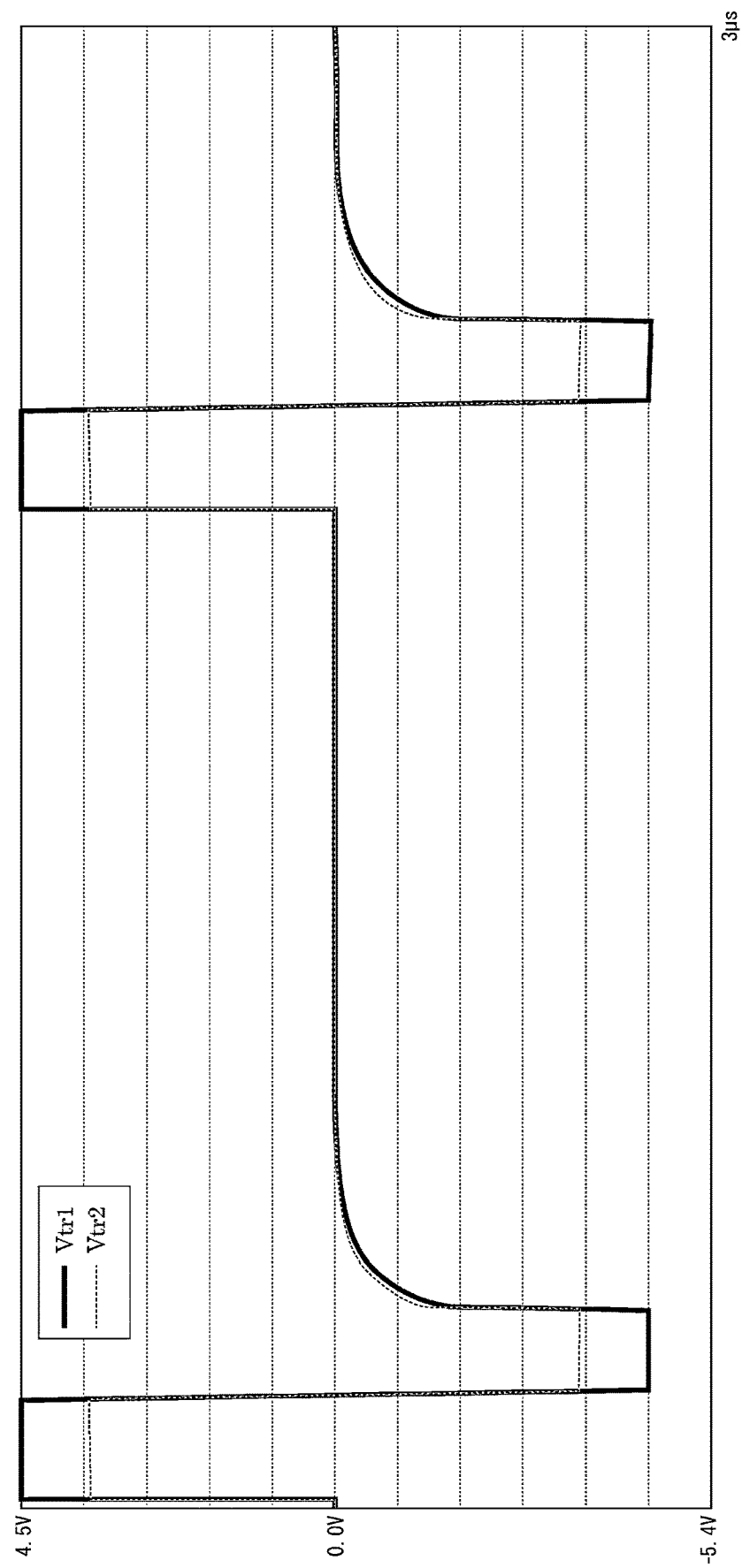
FIG. 2 is a time chart showing a simulation result according to Patent Document 1.
Figure 3:
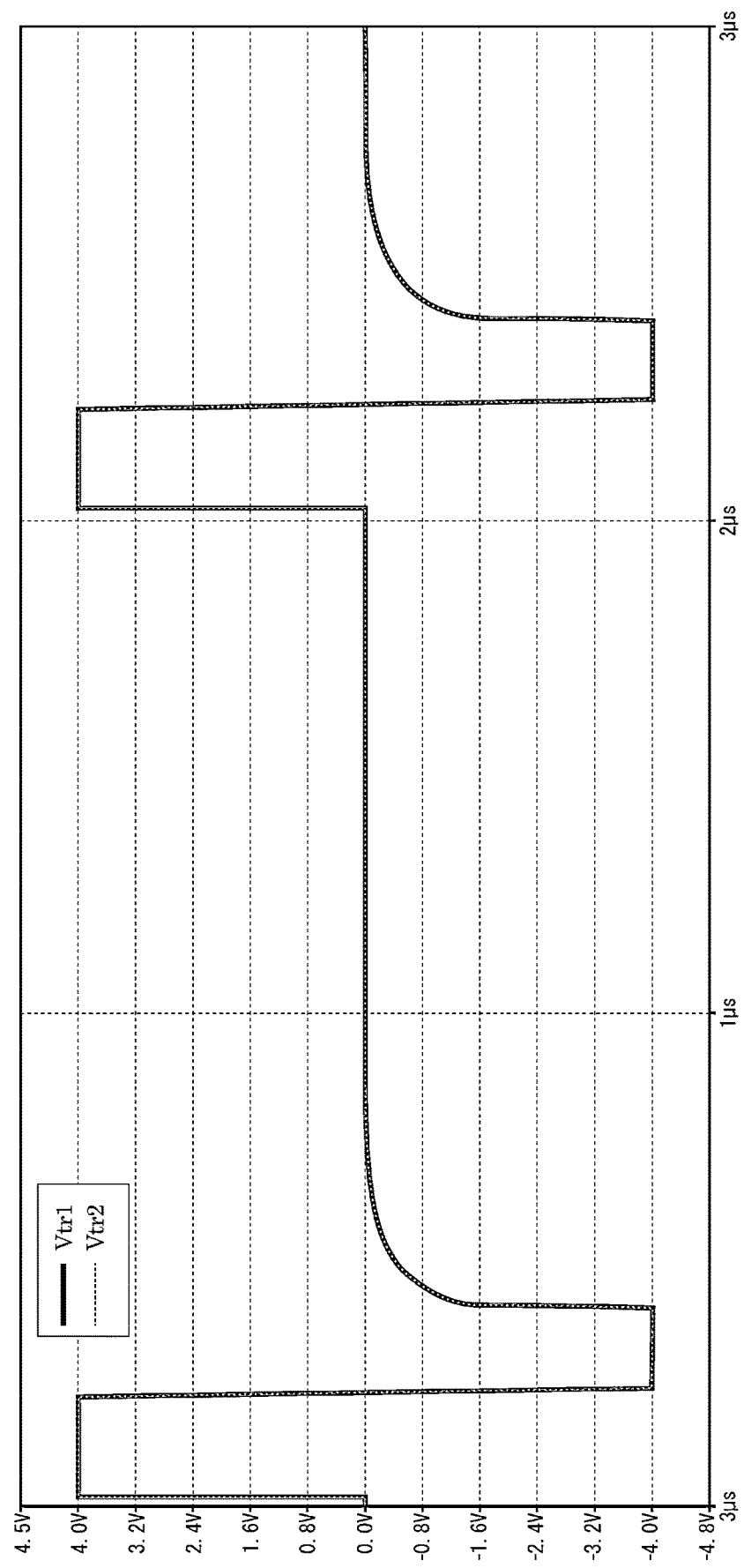
FIG. 3 is a time chart showing a simulation result according to the first embodiment.

FIG. 2 shows a simulation result according to Patent Document 1. FIG. 3 shows a simulation result according to the first embodiment. These simulation results are ones in case of connecting pulse transformers tr1 and tr2 in series and setting a difference of 27.5% in inductance value between the pulse transformers tr1 and tr2.

The simulation result of FIG. 3 shows that a voltage Vtr1 of the pulse transformer tr1 and a voltage Vtr2 of the pulse transformer tr2 are substantially same with each other in waveform. This shows that the auxiliary winding 3 serves to even the voltages exerted on the pulse transformers tr1 and tr2, and the mathematical expressions described above are correct.

(Effects)

The first embodiment is configured to dispose the auxiliary winding 3 between the pulse transformers tr1 and tr2, the primary windings of which are connected in series, and thereby establish magnetic coupling with the pulse transformers tr1 and tr2. This serves to even voltage allotments exerted on the pulse transformers tr1 and tr2, even in case of unevenness in excitation inductance between the pulse transformers tr1 and tr2 due to causes such as unevenness in manufacturing of the pulse transformers.

This achieves the following effects (1) and (2).

(1) The pulse transformers tr1 and tr2 are reduced in iron loss, and thereby can be reduced in size of cores thereof.

(2) Components in the secondary-side circuit can be levelled and reduced in duty. This serves for enhancement of reliability, or serves to allow employment of low-duty circuit components and thereby reduce costs.

In comparison with conventional pulse transformers, the first embodiment additionally includes the auxiliary winding, while allowing downsizing of the cores due to reduction in iron loss of the pulse transformers.

This is because a circuit with a pulse transformer, whether based on conventional arts or the first embodiment, is configured to secure a sufficient distance between a primary side and a secondary side for securing an insulation distance and then employ low-turns windings as both a primary winding and a secondary winding. This allows to add an auxiliary winding of one turn or so closely to the secondary winding, without any influence on dimensions.

Thus, the first embodiment serves to downsize pulse transformers and thereby downsize power converters.

Second Embodiment

Figure 4:
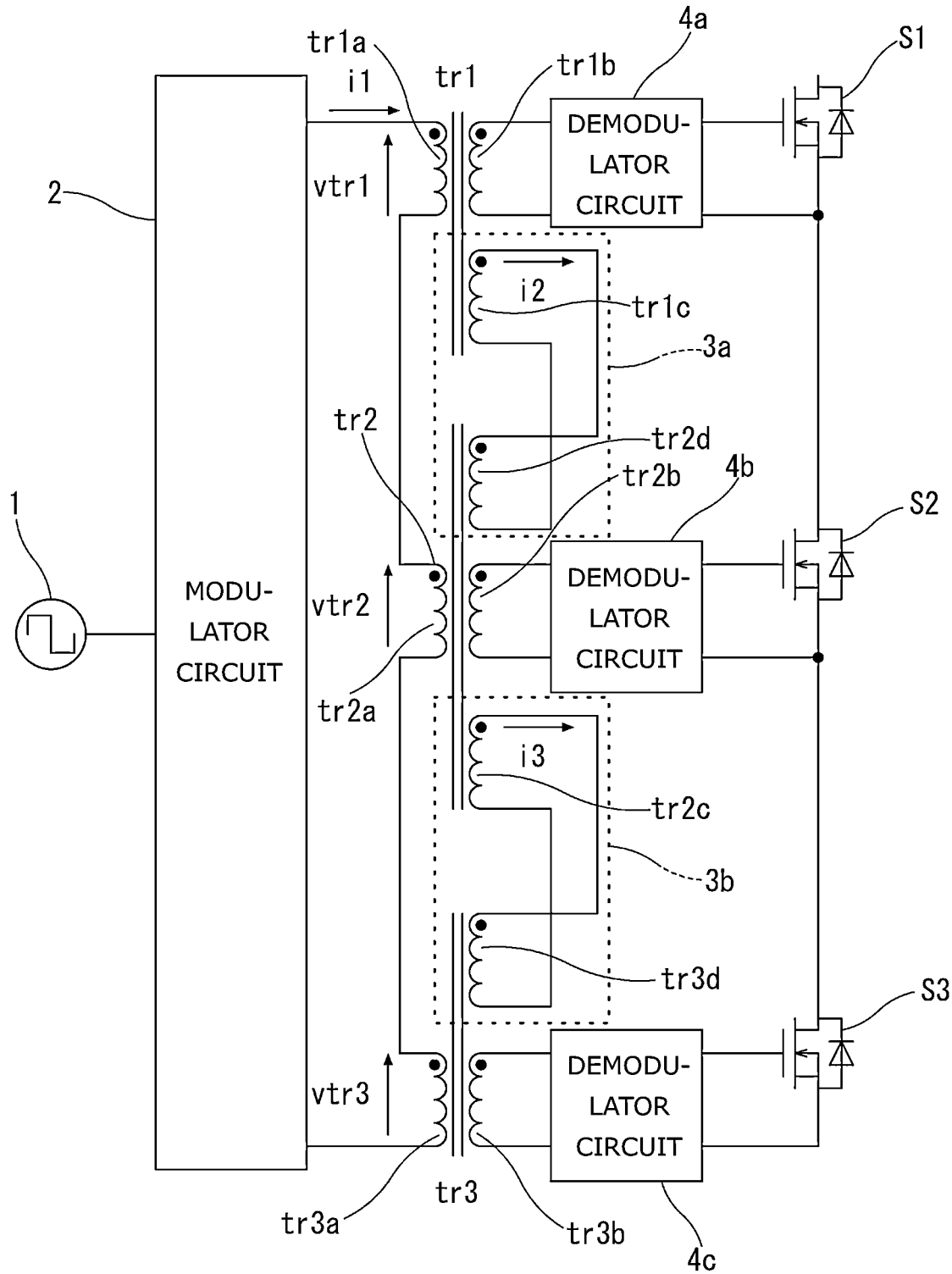
FIG. 4 is a diagram showing a gate drive circuit of a power converter according to a second embodiment.

FIG. 4 shows a circuit configuration of a gate drive circuit of a power converter according to the second embodiment. The second embodiment exemplifies a case of connecting three semiconductor devices S1, S2, and S3 in series and connecting three pulse transformers tr1, tr2, and tr3 in series. Corresponding to the three semiconductor devices S1, S2, and S3 and the three pulse transformers tr1, tr2, and tr3, also three demodulator circuits 4a, 4b, and 4c are provided.

The first-stage pulse transformer tr1 includes a primary winding tr1a and a secondary winding tr1b, and is further provided with a post-stage coupling auxiliary winding tr1c. The post-stage coupling auxiliary winding tr1c serves to establish magnetic coupling with the post-stage pulse transformer tr2.

The second-stage pulse transformer tr2 includes a primary winding tr2a and a secondary winding tr2b, and is further provided with a pre-stage coupling auxiliary winding tr2d and a post-stage pulse transformer tr2c. The pre-stage coupling auxiliary winding tr2d serves to establish magnetic coupling with the pre-stage pulse transformer tr1. The post-stage pulse transformer tr2c serves to establish magnetic coupling with the post-stage pulse transformer tr3.

The third-stage pulse transformer tr3 includes a primary winding tr3a and a secondary winding tr3b, and is further provided with a pre-stage coupling auxiliary winding tr3d. The pre-stage coupling auxiliary winding tr3d serves to establish magnetic coupling with the pre-stage pulse transformer tr2.

The post-stage coupling auxiliary winding tr1c provided for the first-stage pulse transformer tr1 and the pre-stage coupling auxiliary winding tr2d provided for the second-stage pulse transformer tr2 are connected to each other. The post-stage pulse transformer tr2c provided for the second-stage pulse transformer tr2 and the pre-stage coupling auxiliary winding tr3d provided for the third-stage pulse transformer tr3 are connected to each other.

The post-stage coupling auxiliary winding tr1c and the pre-stage coupling auxiliary winding tr2d are connected to each other, and thereby form an auxiliary winding 3a. The post-stage pulse transformer tr2c and the pre-stage coupling auxiliary winding tr3d are connected to each other, and thereby form an auxiliary winding 3b. The auxiliary winding 3a establishes magnetic coupling between the pulse transformers tr1 and tr2. The auxiliary winding 3b establishes magnetic coupling between the pulse transformers tr2 and tr3.

The second-stage pulse transformer tr2 is coupled to both of the auxiliary windings of the first-stage pulse transformer tr1 and the third-stage pulse transformer tr3. This allows balancing of voltages exerted on the pulse transformers tr1 and tr3 the auxiliary windings of which are not directly coupled.

An electric current i1 flows in the primary windings tr1a to tr3a of the pulse transformers tr1 to tr3. An electric current i2 flows in the auxiliary winding 3a. An electric current i3 flows in the auxiliary winding 3b.

In case that the pulse transformers tr1 to tr3 have unevenness in excitation inductance and thereby have differences in voltage exerted on the pulse transformers tr1 to tr3, the electric currents flow in the auxiliary windings 3a and 3b. This balances the voltages exerted on the pulse transformers tr1 to tr3. This effect of the auxiliary windings 3a and 3b can be proved with use of mathematical expressions as follows.

The followings mathematical expressions (8), (9), and (10) respectively express a voltage vtr1 exerted on the pulse transformer tr1, a voltage vtr2 exerted on the pulse transformer tr2, and a voltage vtr3 exerted on the pulse transformer tr3, where: L1 is a self-inductance of the pulse transformer tr1; M1 is a mutual inductance between the pulse transformer tr1 and the post-stage coupling auxiliary winding tr1c; L2 is a self-inductance of the pulse transformer tr2; M2 is a mutual inductance between the pulse transformer tr2 and the pre-stage coupling auxiliary winding tr2d; M3 is a mutual inductance between the pulse transformer tr2 and the post-stage pulse transformer tr2c; L3 is a self-inductance of the pulse transformer tr3; and M4 is a mutual inductance between the pulse transformer tr3 and the pre-stage coupling auxiliary winding tr3d.

[Mathematical Expression 8]

$$vtr1 = L1\frac{di1}{dt} - M1\frac{di2}{dt} \quad (8)$$

[Mathematical Expression 9]

$$vtr2 = L2\frac{di1}{dt} + M2\frac{di2}{dt} - M3\frac{di3}{dt} \quad (9)$$

[Mathematical Expression 10]

$$vtr3 = L3\frac{di1}{dt} + M4\frac{di3}{dt} \quad (10)$$

The following mathematical expressions (11), (12), (13), (14), and (15) respectively express the mutual inductance M1 between the pulse transformer tr1 and the post-stage coupling auxiliary winding tr1c, the mutual inductance M2 between the pulse transformer tr2 and the pre-stage coupling auxiliary winding tr2d, the mutual inductance M3 between the pulse transformer tr2 and the post-stage pulse transformer tr2c, the mutual inductance M4 between the pulse transformer tr3 and the pre-stage coupling auxiliary winding tr3d, and a mutual inductance M5 between the auxiliary winding 3a and the auxiliary winding 3b, where: L4 is a self-inductance of the post-stage coupling auxiliary winding tr1c provided for the pulse transformer tr1; k1 is a magnetic coupling factor between the pulse transformer tr1 and the post-stage coupling auxiliary winding tr1c; L5 is a self-inductance of the pre-stage coupling auxiliary winding tr2d provided for the pulse transformer tr2; k2 is a magnetic coupling factor between the pulse transformer tr2 and the pre-stage coupling auxiliary winding tr2d; L6 is a self-inductance of the post-stage pulse transformer tr2c provided for the pulse transformer tr2; k3 is a magnetic coupling factor between the pulse transformer tr2 and the post-stage pulse transformer tr2c; L7 is a self-inductance of the pre-stage coupling auxiliary winding tr3d provided for the pulse transformer tr3; k4 is a magnetic coupling factor between the pulse transformer tr3 and pre-stage coupling auxiliary winding tr3d; and k5 is a magnetic coupling factor between the auxiliary winding 3a and the auxiliary winding 3b.

[Mathematical Expression 11]

$$M1 = k1\sqrt{L1L4} \quad (11)$$

[Mathematical Expression 12]

$$M2 = k2\sqrt{L2L5} \quad (12)$$

[Mathematical Expression 13]

$$M3 = k3\sqrt{L2L6} \quad (13)$$

[Mathematical Expression 14]

$$M4 = k4\sqrt{L3L7} \quad (14)$$

[Mathematical Expression 15]

$$M5 = k5\sqrt{L5L6} \quad (15)$$

The following mathematical expressions (16) and (17) respectively express a voltage equation in the auxiliary winding 3a and a voltage equation in the auxiliary winding 3b which are derived from the Kirchhoff's law.

[Mathematical Expression 16]

$$M1\frac{di1}{dt} - M2\frac{di1}{dt} + M5\frac{di3}{dt} - L4\frac{di2}{dt} - L5\frac{di2}{dt} = 0 \quad (16)$$

[Mathematical Expression 17]

$$M3\frac{di1}{dt} - M4\frac{di1}{dt} + M5\frac{di2}{dt} - L6\frac{di3}{dt} - L7\frac{di3}{dt} = 0 \quad (17)$$

Then, assuming that a turns ratio between the primary winding tr1a of the pulse transformer tr1 and the post-stage coupling auxiliary winding tr1c, a turns ratio between the primary winding tr2a of the pulse transformer tr2 and the pre-stage coupling auxiliary winding tr2d, a turns ratio between the primary winding tr2a of the pulse transformer tr2 and the post-stage pulse transformer tr2c, and a turns ratio between the primary winding tr3a of the pulse transformer tr3 and the pre-stage coupling auxiliary winding tr3d are equal to each other, and the magnetic couplings are ideally established (i.e., the coupling factors k1=k2=k3=k4=k5=1), equations of L4=L1, L5=L2, L6=L2, and L7=L3 are satisfied. Therefore, equations of M1=L1, M2=L2, M3=L2, M4=L3, and M5=L2 are satisfied, and the mathematical expressions (8), (9), (10), (16), and (17) can be respectively transformed into the following mathematical expressions (18), (19), (20), (21), and (22).

[Mathematical Expression 18]

$$vtr1 = L1\frac{di1}{dt} - L1\frac{di2}{dt} \quad (18)$$

[Mathematical Expression 19]

$$vtr2 = L2\frac{di1}{dt} + L2\frac{di2}{dt} - L2\frac{di3}{dt} \quad (19)$$

[Mathematical Expression 20]

$$vtr3 = L3\frac{di1}{dt} + L3\frac{di3}{dt} \quad (20)$$

[Mathematical Expression 21]

$$L1\frac{di1}{dt} - L2\frac{di1}{dt} + L2\frac{di3}{dt} - L1\frac{di2}{dt} - L2\frac{di2}{dt} = 0 \quad (21)$$

[Mathematical Expression 22]

$$L2\frac{di1}{dt} - L3\frac{di1}{dt} + L2\frac{di2}{dt} - L2\frac{di3}{dt} - L3\frac{di3}{dt} = 0 \quad (22)$$

Substituting the mathematical expressions (18) and (19) into the mathematical expression (21), the following mathematical expression (23) is obtained.

[Mathematical Expression 23]

$$vtr1 = vtr2 \quad (23)$$

Substituting the mathematical expressions (19) and (20) into the mathematical expression (22), the following mathematical expression (24) is obtained.

[Mathematical Expression 24]

$$vtr2 = vtr3 \quad (24)$$

This shows that the auxiliary windings 3a and 3b according to the second embodiment allow the voltages vtr1, vtr2, and vtr3 exerted on the pulse transformers tr1, tr2, and tr3 to be equated even if excitation inductance values at the pulse transformers tr1, tr2, and tr3 are different from each other.

Thus, the above case of connecting the three pulse transformers tr1, tr2, and tr3 in series has the effects same with the first embodiment.

Third Embodiment

Figure 5:
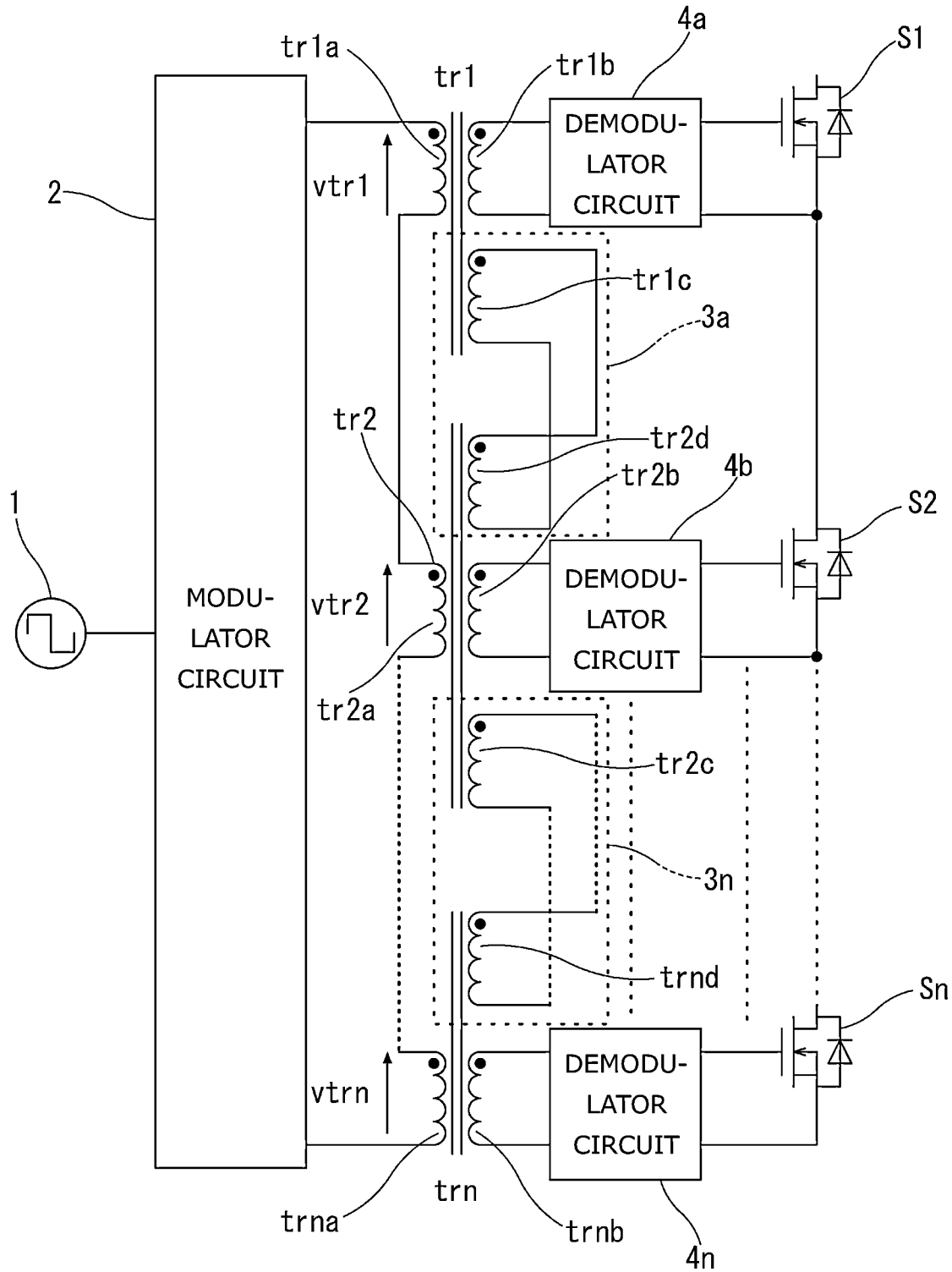
FIG. 5 is a diagram showing a gate drive circuit of a power converter according to a third embodiment.
Figure 6:
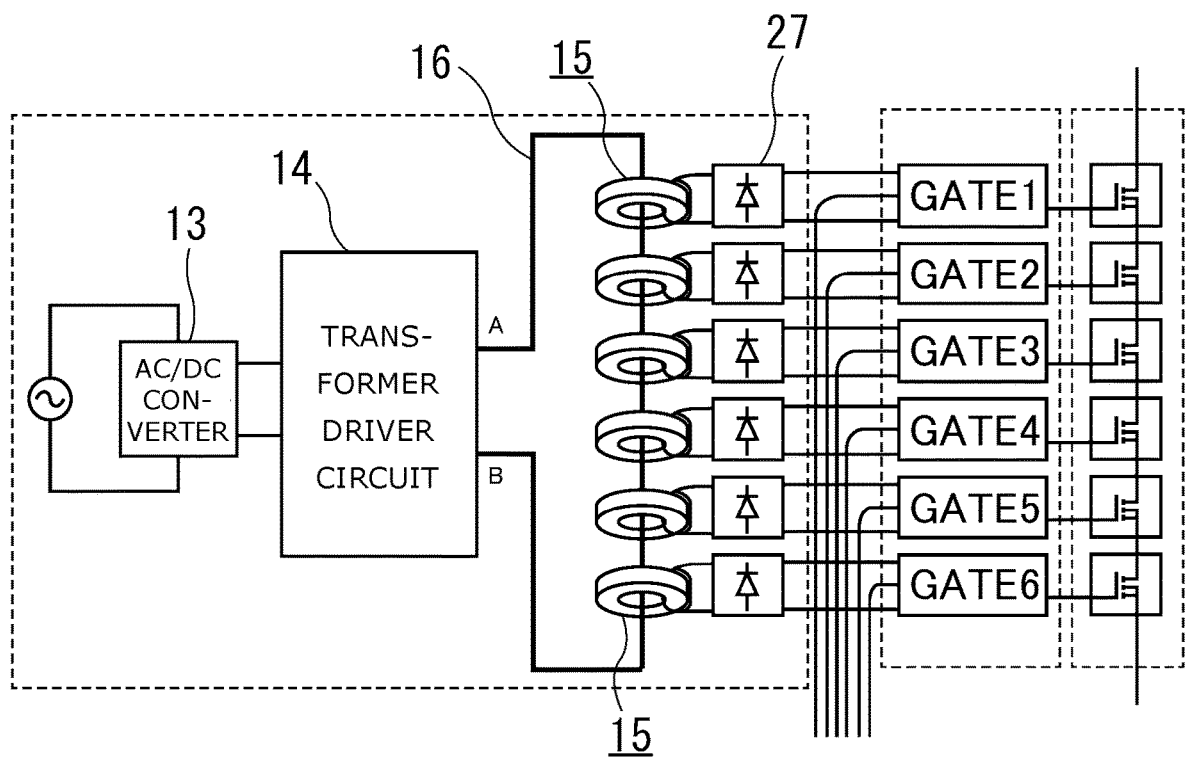
FIG. 6 is a diagram showing a gate drive circuit of a power converter according to Patent Document 1.

FIG. 5 shows a circuit configuration of a gate drive circuit of a power converter according to the third embodiment. The third embodiment exemplifies a case of connecting n semiconductor devices S1 to Sn in series and connecting n pulse transformers tr1 to trn in series, where n is an arbitrary natural number equal to or greater than 2. Corresponding to the n semiconductor devices S1 to Sn and the n pulse transformers tr1 to trn, also n demodulator circuits 4a to 4n are provided.

The first-stage pulse transformer tr1 includes a primary winding tr1a and a secondary winding tr1b, and is further provided with a post-stage coupling auxiliary winding tr1c that establishes magnetic coupling with the post-stage pulse transformer tr2.

Each of the pulse transformers tr2 to trn−1 in stages between the first stage and the nth stage includes a primary winding and a secondary winding, and is further provided with a pre-stage coupling auxiliary winding that establishes magnetic coupling with a pre-stage pulse transformer and a post-stage coupling auxiliary winding that establishes magnetic coupling with a post-stage pulse transformer.

The nth-stage pulse transformer trn includes a primary winding trna and a secondary winding trnb, and is further provided with a pre-stage coupling auxiliary winding trnd that establishes magnetic coupling with the pre-stage pulse transformer trn−1.

Thus, the post-stage coupling auxiliary winding of the kth-stage pulse transformer and the pre-stage coupling auxiliary winding of the (k+1)th-stage pulse transformer are connected to each other, where k is one of natural numbers from 1 to n−1. In other words, any pulse transformer except the first-stage one and the nth stage one is connected to both of the auxiliary windings of the upper-stage pulse transformer and the lower-stage pulse transformer.

The first embodiment corresponds to a case of n=2, in which no pulse transformer exists between the first stage and the nth stage.

The second embodiment corresponds to a case of n=3, in which the pulse transformer tr2 exists between the first stage and the nth stage.

According to the third embodiment, in case that the pulse transformers are uneven in excitation inductance and thereby have differences in voltage exerted on the pulse transformers, electric currents flow in the auxiliary windings. This balances the voltages exerted on the pulse transformers. Details of these actions are similar to the first and second embodiments, and are accordingly omitted.

The above explains in detail only the specific examples described herewith. As is obvious for a person skilled in the art, the above details may be variously changed or modified within scope of technical ideas of the present invention. Such changes and modifications naturally belong to scope of the present claims.

The invention claimed is:

1. A gate drive circuit of a power converter, the gate drive circuit comprising:
    semiconductor devices connected in series;
    pulse transformers each of which includes a primary winding and a secondary winding, wherein:
    the primary windings of the pulse transformers are connected in series;
    the secondary windings of the pulse transformers are respectively connected to the semiconductor devices directly or indirectly; and
    the pulse transformers establish insulation between a primary side and a secondary side of the pulse transformers, while transmitting electric power or electric power and control signals from the primary side to the secondary side;
    an auxiliary windings that establishes magnetic coupling between the pulse transformers; and
    n stages of the pulse transformers, where n is a natural number equal to or greater than 2,
    wherein:
        the pulse transformer of a first stage is provided with a post-stage coupling auxiliary winding that establishes magnet coupling with the pulse transformer of a post-stage of the first stage;
        the pulse transformer of each stage except the first stage and a n-th stage is provided with: a pre-stage coupling auxiliary winding that establishes magnet coupling with the pulse transformer of a pre-stage of the each stage; and a post-stage coupling auxiliary winding that establishes magnet coupling with the pulse transformer of a post-stage of the each stage;
        the pulse transformer of the n-th stage is provided with a pre-stage coupling auxiliary winding that establishes magnet coupling with the pulse transformer of a pre-stage of the n-th stage; and
        the post-stage coupling auxiliary winding of the pulse transformer of a k-th stage and the pre-stage coupling auxiliary winding of the pulse transformer of a (k+1)-th stage are connected to each other, and are disconnected from a rest of the post-stage coupling auxiliary windings and the pre-stage coupling auxiliary windings of the n stages of the pulse transformers, where k is one of natural numbers from 1 to n−1.

* * * * *